United States Patent
Hein

(10) Patent No.: US 7,015,407 B2
(45) Date of Patent: Mar. 21, 2006

(54) HIDDEN SWITCH FOR MOTOR VEHICLE

(75) Inventor: David A. Hein, Sterling Heights, MI (US)

(73) Assignee: Lear Corporation, Southfield, MI (US)

( * ) Notice: Subject to any disclaimer, the term of this patent is extended or adjusted under 35 U.S.C. 154(b) by 132 days.

(21) Appl. No.: 10/745,240

(22) Filed: Dec. 22, 2003

(65) Prior Publication Data

US 2005/0133351 A1  Jun. 23, 2005

(51) Int. Cl.
*H01H 9/10* (2006.01)

(52) U.S. Cl. .................. 200/310; 200/5 R; 701/1; 701/29

(58) Field of Classification Search ........ 200/310–314, 200/512, 517, 5 R, 5 A; 701/1, 200, 211, 701/29, 30
See application file for complete search history.

(56) References Cited

U.S. PATENT DOCUMENTS

| | | | |
|---|---|---|---|
| 4,562,315 A | 12/1985 | Aufderheide | |
| 4,894,493 A * | 1/1990 | Smith et al. | 200/5 A |
| 5,453,586 A * | 9/1995 | Stottmann | 200/5 R |
| 5,512,718 A | 4/1996 | Larose | |
| 5,594,222 A | 1/1997 | Caldwell | |
| 5,942,815 A * | 8/1999 | Neuman et al. | 307/139 |
| 6,009,355 A * | 12/1999 | Obradovich et al. | 701/1 |
| 6,119,060 A * | 9/2000 | Takayama et al. | 701/36 |
| 6,175,782 B1 * | 1/2001 | Obradovich et al. | 701/1 |
| 6,310,611 B1 | 10/2001 | Caldwell | |
| 6,320,282 B1 | 11/2001 | Caldwell | |
| 6,330,497 B1 * | 12/2001 | Obradovich et al. | 701/1 |
| 6,438,465 B1 * | 8/2002 | Obradovich et al. | 701/1 |
| 6,542,794 B1 * | 4/2003 | Obradovich | 701/1 |
| 6,574,531 B1 * | 6/2003 | Tan et al. | 701/1 |
| 2002/0057020 A1 | 5/2002 | Caldwell | |
| 2003/0121767 A1 | 7/2003 | Caldwell | |

* cited by examiner

*Primary Examiner*—K. Lee
(74) *Attorney, Agent, or Firm*—MacMillan, Sobanski & Todd, LLC

(57) ABSTRACT

A non-movable switch is located behind an interior trim component of a motor vehicle. The location of the switch is hidden until a status condition of the motor vehicle occurs. When the status condition occurs, the location of the switch becomes visibly apparent and the switch becomes active and operable.

20 Claims, 4 Drawing Sheets

HIDDEN SWITCH FOR MOTOR VEHICLE

BACKGROUND OF INVENTION

This invention relates in general to motor vehicles and more particularly to an interface for controlling operations of a motor vehicle. Most particularly, the invention relates to a switch for motor vehicles.

A conventional interface for a motor vehicle typically includes a switch or switch array, which generally comprises a large number of switches, that are mounted in and around the armrests, console and/or dashboard of the motor vehicle. Some switches are operable to actuate and de-actuate different electrically operated devices. Other switches are commonly referred to as status switches, which are used during certain status conditions of the motor vehicle, such as when a scheduled oil change is due, a low tire pressure condition exists, the motor vehicle trip odometer is activated, or the time clock change function is activated.

Conventional motor vehicle switches are mechanical switches having physically moving (e.g., sliding) parts that create contact between conductors. The switches are supported in openings in a motor vehicle interior trim component. The openings in which the switches are supported commonly attract dust and dirt, which is difficult to reach. Consequently, the interior trim component is difficult to clean. The requirement for openings in motor vehicle interior trim components also requires increased cut lines, leading to increased production time and cost.

The physical characteristics of convention motor vehicle switches usually occupy a space (i.e., usually about 0.5 to 5 mm) for the movement of the mechanical switches. The space limits the ability to style and craft the interior components (e.g., the armrest, console, and/or dashboard) of the motor vehicle. The switches are also subject to wear and mechanical breakdown due to the moving parts and thus may become unreliable. Moreover, the unique character of each switch requires an increased parts count and consequently, increased inventory cost.

Status switches, in particular, are often in obscure locations due to the infrequent use of such switches. The location of some status switches, such as an oil change switch, which is typically in the motor vehicle fuse box, makes it difficult to find and operate the switch. Moreover, since status switches are infrequently used, the motor vehicle manufacturers prefer that the switches not impact the styling of the vehicle.

What is needed is a highly reliable status switch that is easy to use and that does not interfere with the styling of motor vehicle interior trim components.

SUMMARY OF INVENTION

The present invention is directed towards a hidden switch that meets the foregoing needs. The switch is a non-movable switch that is located behind an interior trim component for a motor vehicle. The location of the switch is visibly apparent only when a motor vehicle status condition occurs. Moreover, the switch is active and operable only when the status condition occurs.

Various objects and advantages of this invention will become apparent to those skilled in the art from the following detailed description of the preferred embodiment, when read in light of the accompanying drawings.

DETAILED DESCRIPTION

Figure 1:
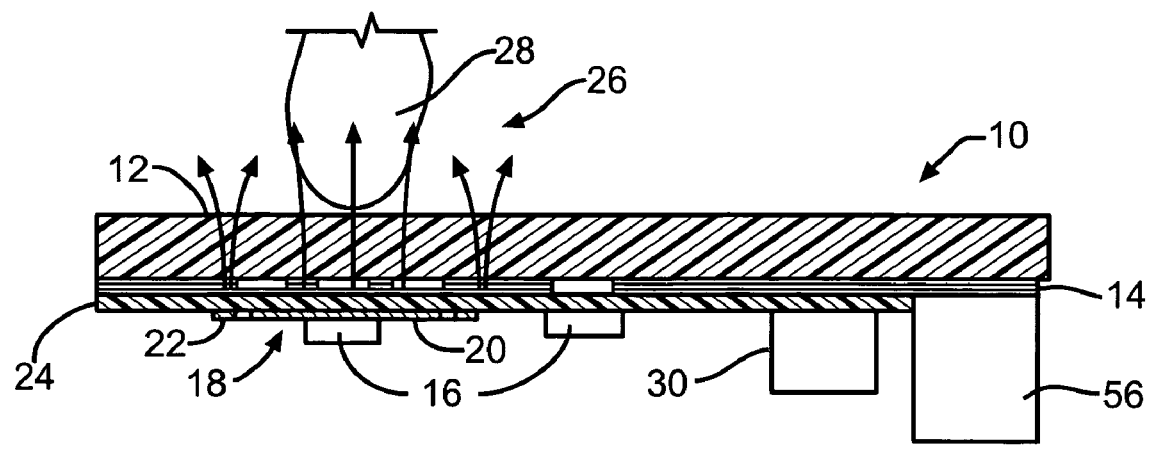
FIG. 1 is a cross-sectional view in plan of an interior trim component of a motor vehicle supporting a hidden switch and an audio driver assembly, wherein an electric field is generated by the switch and a stimulus causes disturbance in the electric field.

Referring now to the drawings, there is illustrated in FIG. 1 a portion of an interior trim component 10 of a motor vehicle. The interior trim component 10 is preferably made of a material, such as a plastic-based material, that may be molded or otherwise crafted as desired to produce a substantially rigid structure having a desired style. The molding of interior trim components is well known to those of ordinary skill in the art of the invention and thus will not be described in further detail.

The interior trim component 10 may comprise a trim bezel, faceplate, or fascia 12. The fascia 12 of the interior trim component 10 may be in the form of an acrylic, polycarbonate or other lightweight, high-performance material and is ideally a tough, durable, shatter-resistant, and heat-resistant material. The fascia 12 is preferably a relatively dark transparent or translucent material, such as a smoked polycarbonate material.

An applique 14, which may include one or more layers, may be disposed behind or adjacent the fascia 12 (i.e., below the fascia 12 when viewing FIG. 1). The applique 14 may, for example, have an outermost dark transparent or translucent layer, such as a black film or paint layer. An innermost layer may be provided behind or adjacent the outermost layer (i.e., below the outermost layer when viewing FIG. 1). The innermost layer may be a lighter color, which preferably contrasts well with the dark outermost layer. Portions of the dark outermost layer may be etched with indicia or one or more symbols and the lighter colored innermost layer may be displayed through the etched portion of the outermost layer. The applique 14 may be backlit with one or more light sources 16, such as light emitting diodes (LEDs), when a certain motor vehicle status condition or conditions occur. Corresponding portions of the innermost layer may also be etched to provide a window through the applique 14. It should be appreciated that the applique 14 is not intended to be limited to the two-layer applique 14 described above but instead may have any number of suitable layers, which may be etched or not, and which preferably contrast well with one another.

A switch 18 is disposed behind or adjacent the applique 14 (below the applique 14 when viewing FIG. 1). In accordance with the present invention, the switch 18 is a non-mechanical or non-movable touch cell or switch, such as but not limited to a resistive, inductive, piezoelectric and capacitive switch. A capacitive switch that is suitable for carrying out the invention may be of the type described, for example, in U.S. Patent Application Publication No. 2002/0057020, published May 16, 2002, the description of which is incorporated herein by reference. The switch 18 may comprise a first electrode 20, a second electrode 22 spaced from and surrounding the first electrode 20, and various electrical components (e.g., one or more resistors, capacitors, IC chips). The electrodes 20, 22 are preferably oriented in the same plane. A signal may be provided to the switch 18 to generate an electric field about the switch 18. Introduction of a stimulus, such as an operator's finger, near the switch 18 may cause a disturbance in the electric field. A control circuit (diagrammatically shown in FIG. 3) may detect the disturbance in the electric field and generate a control signal in response to the disturbance. The control signal may cause a function, such as a resetting function, to be carried out. If desirable, the resultant function may only be carried out if the switch 18 encounters the stimulus for a predetermined period of time. In this way, the risk of the function being inadvertently carried out can be reduced or prevented.

The switch 18 may be supported by a printed circuit board 24 that may be located behind the applique 14 (below the applique 14 and above the switch 18 when viewing FIG. 1). The printed circuit board 24 may be flexible so that the printed circuit board 24 may conform closely to the shape of the fascia 20. In this way, the switch 18 may be located sufficiently close to the fascia 12.

As diagrammatically illustrated in FIG. 1, a portion of the fascia 12 may have a target area 26 where an electric field is generated (e.g., represented by the directional arrows shown). A stimulus, such as an operator's finger, is illustrated at 28. The switch 18 is not operated unless and until the stimulus 28 is moved into the target area 26 and a disturbance of the electric field is detected by the control circuit.

Figure 2:
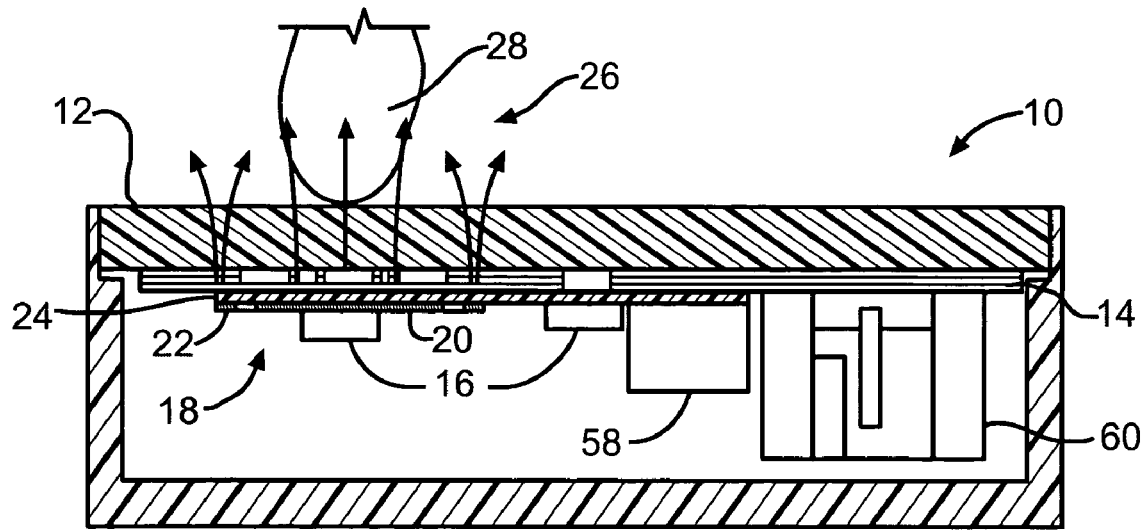
FIG. 2 is a cross-sectional view in plan of an interior trim component of a motor vehicle supporting a hidden switch, a tone generator, and a tactile transducer, wherein an electric field is generated by the switch and a stimulus causes disturbance in the electric field.

Now with reference to FIG. 2, there is illustrated a portion of an interior trim component 10 of a motor vehicle. The interior trim component 10 may comprise a trim bezel, faceplate, or fascia 12 and be the same or similar to the interior trim component 10 described above.

An applique 14, which may include one or more layers, may be disposed behind or adjacent the fascia 12 (i.e., below the fascia 12 when viewing FIG. 2). The applique 14 may, for example, have an outermost dark transparent or translucent layer, such as a black film or paint layer. An innermost layer may be provided behind or adjacent the outermost layer (i.e., below the outermost layer when viewing FIG. 2). The innermost layer may be a lighter color, which preferably contrasts well with the dark outermost layer. Portions of the dark outermost layer may be etched with indicia or one or more symbols and the lighter colored innermost layer may be displayed through the etched portion of the outermost layer. The applique 14 may be backlit with one or more light sources 16, such as LEDs, when a certain motor vehicle status condition or conditions occur. Corresponding portions of the innermost layer may also be etched to provide a window through the applique 14. It should be appreciated that the applique 14 is not intended to be limited to the two-layer applique 14 described above but instead may have any number of suitable layers, which may be etched or not, and which preferably contrast well with one another.

A switch 18 is disposed behind or adjacent the applique 14 (below the applique 14 when viewing FIG. 2). In accordance with the present invention, the switch 18 is a non-mechanical or non-movable touch cell or switch, such as but not limited to a resistive, inductive, piezoelectric and capacitive switch. A capacitive switch that is suitable for carrying out the invention may be of the type described, for example, in the aforementioned U.S. Patent Application Publication. The switch 18 may comprise a first electrode 20 and a second electrode 22 spaced from and surrounding the first electrode 20. The electrodes 20, 22 are preferably oriented in the same plane. A signal may be provided to the switch 18 to generate an electric field about the switch 18. Introduction of a stimulus (shown in FIG. 2), such as an operator's finger, near the switch 18 may cause a disturbance in the electric field. A control circuit (diagrammatically shown in FIG. 3) may detect the disturbance in the electric field and generate a control signal in response to the disturbance. The control signal may cause a function, such as a resetting function, to be carried out. If desirable, the resultant function may only be carried out if the switch 18 encounters the stimulus for a predetermined period of time. In this way, the risk of the function being inadvertently carried out can be reduced or prevented.

The switch 18 may be supported by a printed circuit board 24 that may be located behind the applique 14 (below the applique 14 and above the switch 18 when viewing FIG. 2). The printed circuit board 24 may be flexible so that the printed circuit board 24 may conform closely to the shape of the fascia 20. In this way, the switch 18 may be located sufficiently close to the fascia 12.

As diagrammatically illustrated in FIG. 2, a portion of the fascia 12 may have a target area 26 where an electric field is generated (e.g., represented by the directional arrows shown). A stimulus, such as an operator's finger, is illustrated at 28. The switch 18 is not operated unless and until the stimulus 28 is moved into the target area 26 and a disturbance of the electric field is detected by the control circuit.

According to the preferred embodiment of the invention, the switch 18 is suitable for use as a resettable status switch, the location of which becomes visibly apparent to indicate the occurrence of a status condition of the motor vehicle, such as a scheduled oil change being due, the existence of a low tire pressure condition, the activation of the motor vehicle trip odometer, or the activation of the motor vehicle time clock change function, all of which will be described, by example, in detail in the description hereinbelow. It is preferred that the apparent location of the switch 18 be hidden until a certain motor vehicle condition associated with the switch 18 occurs. Then, the location of the switch 18 becomes visibly apparent. The switch 18 also becomes activate to permit the switch 18 to be operated and the function of the switch 18 to be carried out.

Figure 3:
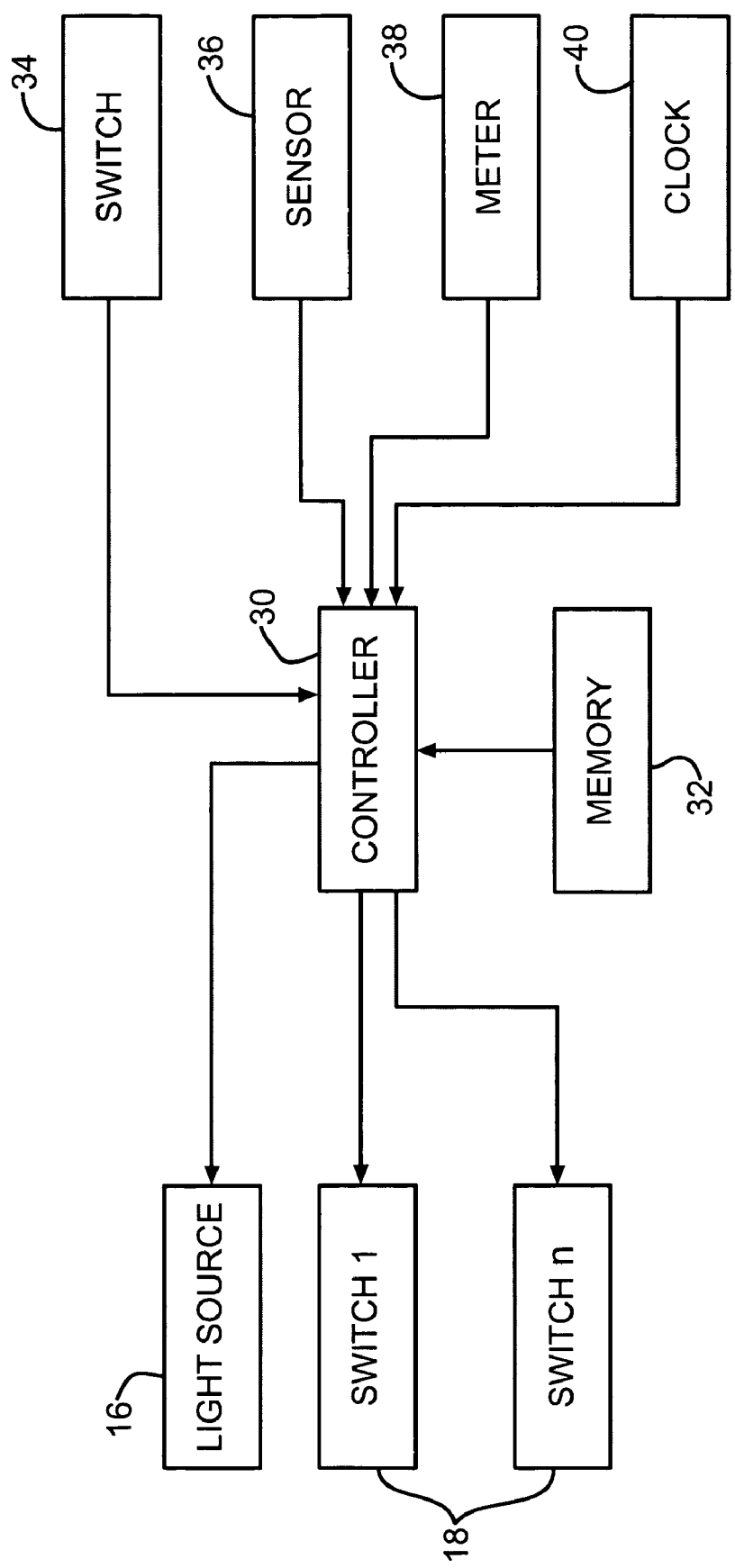
FIG. 3 is a diagrammatic representation of a system for controlling the apparent visibility of the location of a hidden switch according to the invention and the activation of the same.

Making the location of the switch 18 visibly apparent and the switch 18 active according to a status condition of the motor vehicle may be accomplished in any suitable manner. For example, the motor vehicle may be equipped with a controller, such as a microcontroller or processor, as indicated at 30 in FIG. 3, and instructions in memory 32 accessed by the controller 30. The controller 30 and suitable control circuitry may be supported by or otherwise connected to the printed circuit board 24 (shown in FIG. 1) to control the operation of one of more light sources 16 and the switch 18 to make the location of the switch 18 visibly apparent and active the switch 18. The controller 30 can be coupled to inputs, which establish status conditions for controlling the operation of the light sources 16 and the switch 18. Such inputs include but are not limited to one or more switches 34, sensors 36, meters 38, and/or clocks 40, as shown in FIG. 3.

Figure 4:
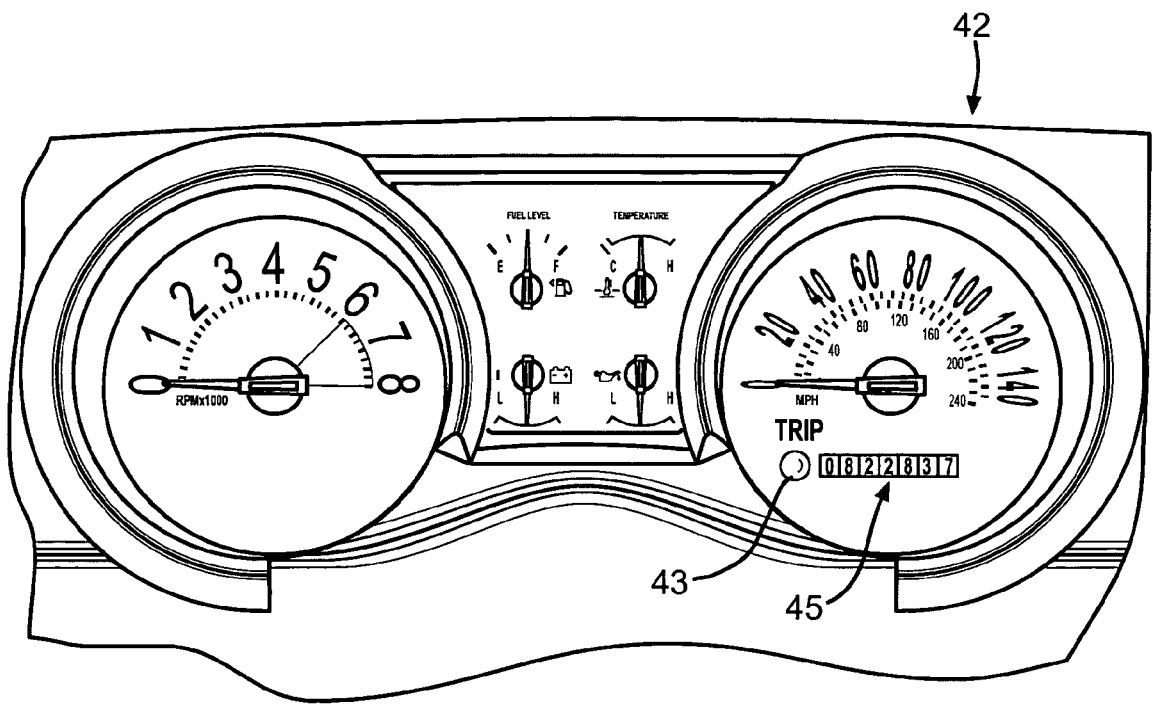
FIG. 4 is a front elevational view of a motor vehicle instrument panel, wherein with the location of status switches is hidden and the switches are inactive.
Figure 5:
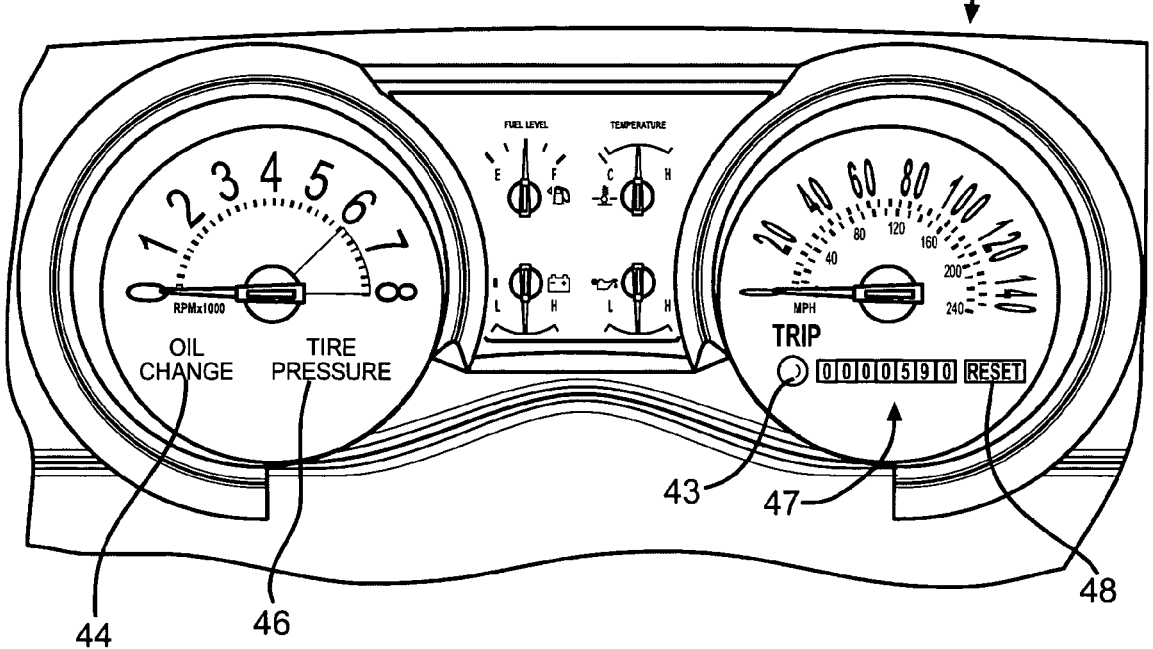
FIG. 5 is a front elevational view of the instrument panel shown in FIG. 4, wherein the location of the status switches is made visibly apparent and the switches are made active.

Examples of status switches according to the invention are illustrated by comparison in FIGS. 4 and 5, wherein an instrument cluster is illustrated at 42. The instrument cluster 42 has conventional meters, gauges, and indicators. In FIG. 4, the location of such switches is hidden from view and the switches are inactive because certain motor vehicle conditions are not met. In FIG. 5, the location of the such switches is visibly apparent and the switches are active to indicate the occurrence of status conditions of the motor vehicle.

As illustrated in FIG. 5, the location of a status switch 44, which is associated with the indicia "OIL CHANGE", has become visibly apparent and the switch 44 has become active. This switch 44 provides an indication that a scheduled motor vehicle oil change is due. The apparent location and activation of the switch 44 may be triggered by a measure of mileage traveled by the motor vehicle via a meter input 38 or by a measure of time via a clock input 40 to the controller 30 (shown in FIG. 3). While the apparent location of the switch 44 is hidden, the switch 44 is inactive and inoperable. When the location of the switch 44 becomes visibly apparent, the switch 44 becomes active and operable. The switch 44 may be reset, preferably after the motor vehicle oil has been changed, by a stimulus in a target area (i.e., the stimulus and target area 28, 26 in FIGS. 1 and 2) associated with the switch 44. Resetting the switch 44 causes the apparent location of the switch 44 to once again become hidden and the switch 44 to once again become inactive until again triggered by another scheduled oil change being due.

Also, as illustrated in FIG. 5, the location of a status switch 46, which is associated with the indicia "TIRE PRESSURE", has become visibly apparent and the switch 46 has become active. This switch 46 provides an indication that a tire pressure has dropped below a reference pressure in one of the motor vehicle tires (not shown). The apparent location and activation of the switch 46 may be triggered by a measure of pressure (i.e., below the referenced pressure) in one of the motor vehicle tires, which may be communicated to the controller 30 via a sensor 36 (shown in FIG. 3) in the tire. While the apparent location of the switch 46 is hidden, this switch 46 is inactive and inoperable. When the location of the switch 46 becomes visibly apparent, the switch 46 becomes active and operable. The switch 46 may be reset, preferably after the tire has been filled with air to a proper tire pressure (i.e., above the reference pressure), by a stimulus in a target area (i.e., the stimulus and target area 28, 26 in FIGS. 1 and 2) associated with the switch 46. Resetting the switch 46 causes the apparent location of the switch 46 to once again become hidden and the switch 46 to once again become inactive until again triggered by a low tire pressure condition (i.e., a pressure below the referenced tire pressure).

Further, as illustrated in FIG. 5, the location of a status switch 48, which is associated with the indicia "TRIP RESET", has also become visibly apparent and the switch has become active. The apparent location and activation of the switch 48 may be triggered, for example, by depressing a "TRIP" switch 43 adjacent the motor vehicle odometer 45 (shown in FIG. 4). This deactivates the motor vehicle odometer 45 and activates or makes visible the motor vehicle trip odometer 47 and further makes visibly apparent the location of the switch 48. While the apparent location of the switch 48 is hidden, the switch 48 is inactive and inoperable. When the location of the switch 48 becomes visibly apparent, the switch 48 becomes active and is operable. By introducing a stimulus in a target area (i.e., the stimulus and target area 28, 26 in FIGS. 1 and 2) of the switch 48, the trip odometer 47 is reset to zero. The apparent visibility of the location of the switch 48 is once again hidden by depressing the switch 48 and the switch 48 once again becomes inactive until the "TRIP" switch 43 is again depressed.

Figure 6:
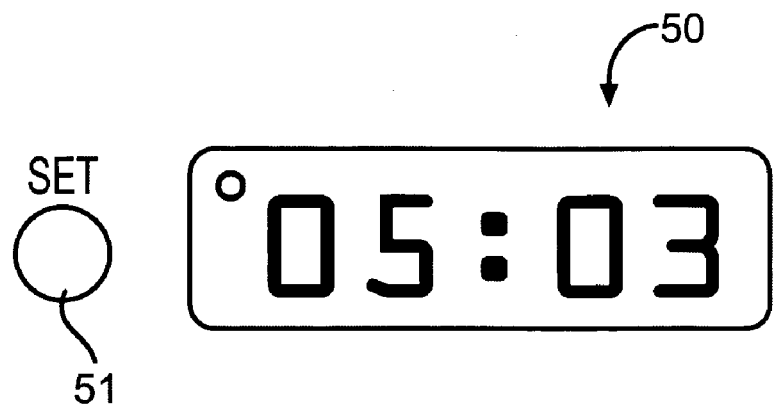
FIG. 6 is a front elevational view of a motor vehicle clock, wherein with the location of status switches is hidden and the switches are inactive.
Figure 7:
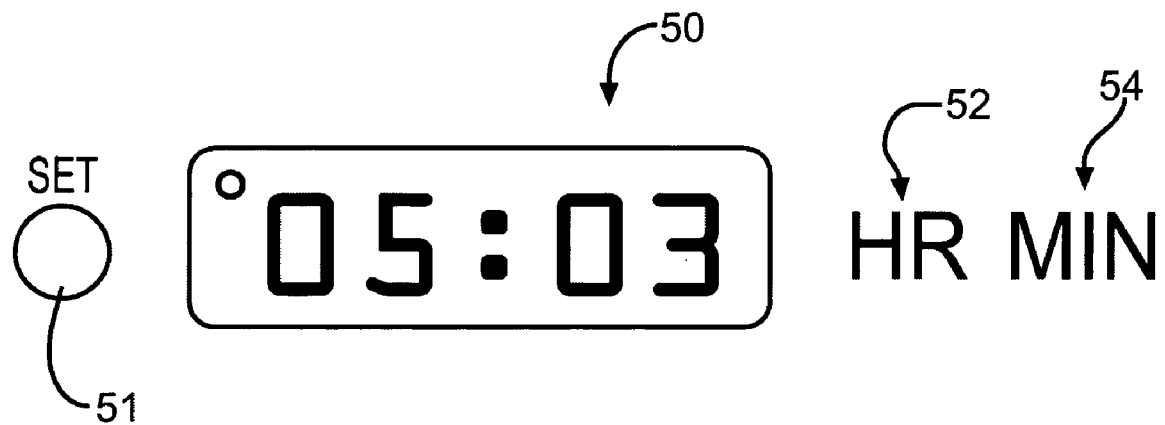
FIG. 7 is a front elevational view of the motor vehicle clock shown in FIG. 6, wherein the location of the status switches is made visibly apparent and the switches are made active.

Other examples of status switches according to the invention are illustrated by comparison in FIGS. 6 and 7, wherein a motor vehicle clock is illustrated at 50. The clock 50 includes a display and a "SET" switch 51. In FIG. 6, the apparent location of the switches is hidden from view and the switches are inactive because a certain motor vehicle condition is not met. In FIG. 7, the location of the switches 52, 54, which are associated with the indicia "HOUR" and "MIN", becomes visibly apparent to indicate the occurrence of a status condition of the motor vehicle (e.g., the activation of the motor vehicle time clock change function) and the switches 52, 54 become active. The visibly apparent location of the switches 52, 54 and the activation of the switches 52, 54 may be triggered, for example, by depressing the "SET" switch 51 adjacent the motor vehicle clock. While the apparent location of the switches 52, 54 is hidden, the switches 52, 54 are inactive and inoperable. When the location of the switches 52, 54 becomes visibly apparent, the switches 52, 54 become active and operable. By introducing a stimulus in a target area (i.e., the stimulus and target area 28, 26 in FIGS. 1 and 2) of the switches 52, 54, the time of the motor vehicle clock may be set as desired. Depressing the "SET" switch 51 once again hides the apparent location of the switches 52, 54 and once again makes the switches 52, 54 inactive until the "SET" switch 51 is again depressed.

The aforementioned status switches are merely examples of switches with which the invention can be practiced. It should be clearly understood that the switches are merely provided for illustrative purposes and that the invention may be practiced with other switches.

It should be appreciated by one of ordinary skill in the art of the invention that the instant invention may employ sensory feedback components, such as audio and/or tactile indicators, to indicate the activation and/or de-activation of switches. The sensory feedback components may be supported by the printed circuit board (e.g., the printer circuit board 24 in FIGS. 1 and 2). The controller 30 and suitable control circuitry (shown in FIG. 3) may control the sensory feedback components. Sensory feedback components may include but are not limited to an audio driver assembly 56, as shown in FIG. 1, and a tone generator 58 and a tactile transducer 60, as shown in FIG. 2. The audio driver assembly 56 may, in addition to providing sensory feedback, function as an audio speaker for the motor vehicle sound system (not shown). The control circuitry may include individual latching switches for toggling light sources 16 and triggering the audio driver assembly 56 and the tone generator 58 and the tactile transducer 60 to produce audio and tactile sensations when a switch 18 is operated. Alternatively, the audio driver assembly 56, the tone generator 58, and the tactile transducer 60 may have an integral controller or control circuitry to control their operation independently.

It should further be appreciated by one of ordinary skill in the art of the invention that the sensitivity of the hidden switches may be adjusted by varying the strength of the electrical field. This can be accomplished by varying the characteristics and/or configurations of the electrodes 20, 22 and/or the values of the electrical components (e.g., the resistors). The intensity of the light sources 16 may also be varied. Moreover, the frequency of the audio driver assembly 56 may be varied to control audio and tactile sensations. For example, higher frequency signals could produce audio sensations while lower frequency signals could produce tactile sensations. Both high and low frequency signals could produce both audible and tactile sensations.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A switch assembly for a motor vehicle, comprising:
   a motor vehicle interior trim component; and
   a non-movable dedicated switch located behind the interior trim component, wherein the location of the switch remains hidden and the switch remains inactive until a status condition occurs and the location of the switch becomes visibly apparent through the interior trim component by illumination provided and the switch becomes active when the status condition occurs.

2. The switch assembly of claim 1, wherein the interior trim component is made of a material that is crafted to produce a substantially rigid structure.

3. The switch assembly of claim 1, wherein the interior trim component comprises a relatively dark transparent or translucent material fascia.

4. The switch assembly of claim 1, further comprising an applique disposed behind the interior trim component, the applique including at least one layer having at least one etched portion; and
   a light source behind the applique, the light source being adapted to illuminate through the applique to make the switch visibly apparent when the status condition occurs.

5. The switch assembly of claim 1, wherein the switch is one of either a resistive, inductive, piezoelectric or capacitive switch.

6. The switch assembly of claim 1, wherein the switch is a capacitive switch.

7. The switch assembly of claim 1, further comprising a control circuit, the switch being adapted to generate an electric field, the control circuit being adapted to detect a disturbance in the electric field and generate a control signal in response to the disturbance, the control signal being adapted to cause a function to be carried out.

8. The switch assembly of claim 1, wherein the switch comprises at least a first electrode and at least a second electrode spaced from and surrounding the first electrode, the first and second electrodes being oriented in the same plane, the switch being adapted to generate an electric field, a disturbance of which is detected by a control circuit to generate a control signal that causes a function to be carried out.

9. The switch assembly of claim 1, wherein the switch is supported by a flexible printed circuit board that is adapted to conform to the shape of the interior trim component.

10. The switch assembly of claim 1, wherein the switch is a resetable switch that is operable to hide the location of the switch and render the switch inactive until the status condition once again occurs.

11. The switch assembly of claim 10, wherein the switch is an oil change switch, the location of which becomes visibly apparent and which becomes active only when a motor vehicle oil change is due.

12. The switch assembly of claim 10, wherein the switch is a tire pressure switch, the location of which becomes visibly apparent and which becomes active only when a motor vehicle tire pressure is below a reference pressure.

13. The switch assembly of claim 1, wherein the switch is a trip odometer reset switch, the location of which becomes visibly apparent and which becomes active only when a motor vehicle trip odometer function is selected.

14. The switch assembly of claim 1, wherein the switch is a clock set switch, the location of which becomes visibly apparent and which becomes active only when a motor vehicle clock set function is selected.

15. The switch assembly of claim 1, further comprising a controller for controlling the apparent visible location of the switch and the activation of the switch.

16. The switch assembly of claim 15, wherein the controller is coupled to inputs which establish the status conditions.

17. The switch assembly of claim 16, wherein the inputs include one or more switches, sensors, meters, or clocks.

18. The switch assembly of claim 16, wherein the sensory feedback component is an audio indicator.

19. The switch assembly of claim 16, wherein the sensory feedback component is a tactile indicator.

20. The switch assembly of claim 1, further comprising at least one sensory feedback component for indicating the activation or de-activation of the switch.

* * * * *